(12) United States Patent
Gong et al.

(10) Patent No.: US 8,642,397 B1
(45) Date of Patent: Feb. 4, 2014

(54) SEMICONDUCTOR WAFER LEVEL PACKAGE (WLP) AND METHOD OF MANUFACTURE THEREOF

(75) Inventors: Yuping Gong, Songjiang (CN); Yan Xun Xue, Los Gatos, CA (US); Ping Huang, Songjiang (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/607,775

(22) Filed: Sep. 9, 2012

(51) Int. Cl.
*H01L 21/44* (2006.01)

(52) U.S. Cl.
USPC ........... 438/127; 438/106; 438/112; 438/113; 438/123; 257/676; 257/678; 257/686; 257/777; 257/782; 257/E21.508

(58) Field of Classification Search
None
See application file for complete search history.

(56) References Cited

U.S. PATENT DOCUMENTS

2004/0009631 A1* 1/2004 Connell et al. ................ 438/127

\* cited by examiner

*Primary Examiner* — Kyoung Lee
(74) *Attorney, Agent, or Firm* — Chein-Hwa Tsao; CH Emily LLC (57) ABSTRACT

A wafer-level semiconductor package method comprising the step of providing a first wafer comprising a plurality of first dies each having a first, a second and a third electrodes formed on its front surface; attaching a second die having a fourth and a fifth electrodes formed on its front surface and a sixth electrode formed at its back surface onto each of the first die of the first wafer with the sixth electrode at the back surface of the second die attached and electrically connected to the second electrode at the front surface of the first die; and cutting the first wafer to singulate individual semiconductor packages.

20 Claims, 12 Drawing Sheets

SEMICONDUCTOR WAFER LEVEL PACKAGE (WLP) AND METHOD OF MANUFACTURE THEREOF

FIELD OF THE INVENTION

The invention relates to the semiconductor package, in particular to a wafer-level package (WLP) and the manufacturing method.

DESCRIPTION OF THE RELATED ART

Heat dissipation and package size are two important parameters of a semiconductor package. In particular, larger exposed area of the package, i.e., better heat dissipation, and smaller package size results in better semiconductor packages.

Figure 1A:
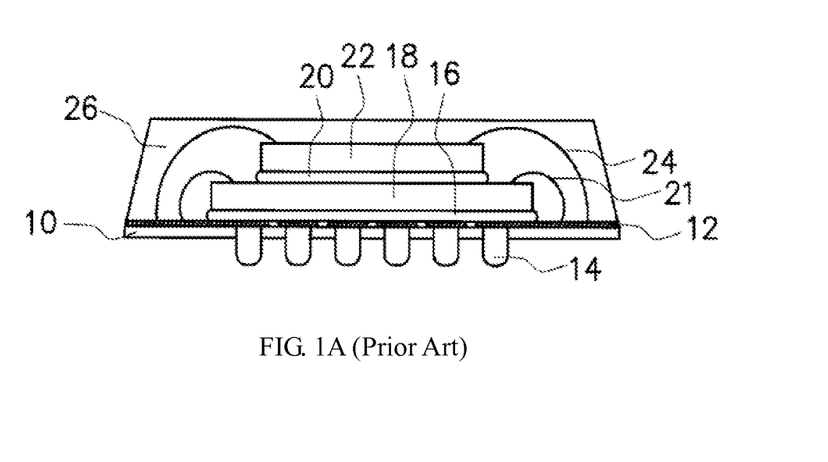
FIG. 1A and FIG. 1B are cross-sectional schematic diagrams of the conventional semiconductor packages.

FIG. 1A is a cross-sectional schematic diagram of a conventional semiconductor package. As shown in FIG. 1, the conventional semiconductor package includes a substrate 10 having a copper pattern 12 at its top surface. A plurality of solder balls 14 are deposited at the bottom surface of the substrate 10 forming electrical connection to an external device or circuit. A die 18 with a larger size is attached onto the substrate 10 through an insulating layer 16, and a die 22 with a smaller size is further attached on the first die 18 through another insulating layer 20. Conductive wires 21 and 24 are formed to electrically connect the die 18 and die 22 to the electrodes on the substrate 10. A molding material 26, for example resin and the like, is deposited for packaging the first die, the second die and the substrate 10.

Figure 1B:
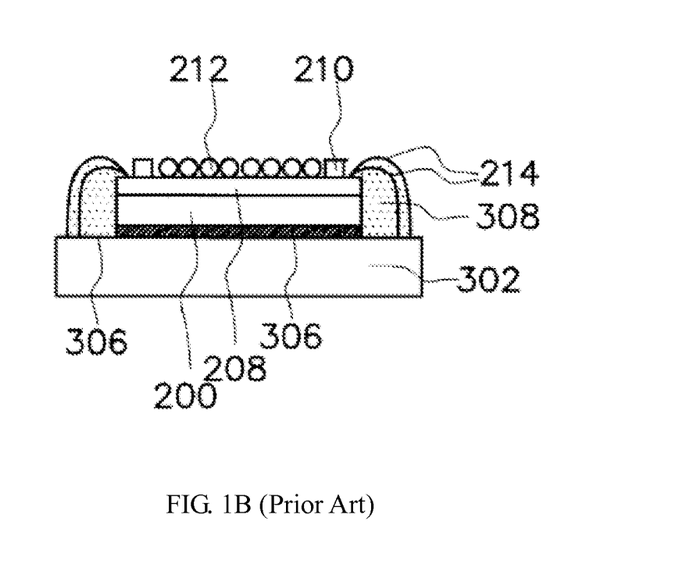

FIG. 1B is a cross-sectional schematic diagram of another conventional semiconductor package. As shown in FIG. 1B, a die 200 with a smaller size is attached on a top surface of a die 302 with a larger size through an insulating layer 306. A pad redistribution layer 208 is formed on a top surface of die 200. Furthermore, a plurality of solder balls 212 are formed in the region surrounding by the insulator 210 on the pad redistribution layer 208. Metal wires 214 are formed to electrically connect die 200 to die 302. A molding material 308 is deposited to fill the region under the metal wires 214 and the exposed surface of the die 302 to protect the metal wires 214.

However, the manufacturing process of making the above conventional semiconductor packages is complicated and the package size and the thermal performance are not optimized.

It is within this context that embodiments of the present invention arise.

BRIEF DESCRIPTION OF THE DRAWINGS

FIG. 2 to FIG. 6 and FIG. 8A to FIG. 8C are schematic diagrams illustrating a method of making a semiconductor package according to an alternative embodiment of the present invention;

DETAILED DESCRIPTION OF THE PREFERRED EMBODIMENTS

Figure 2:
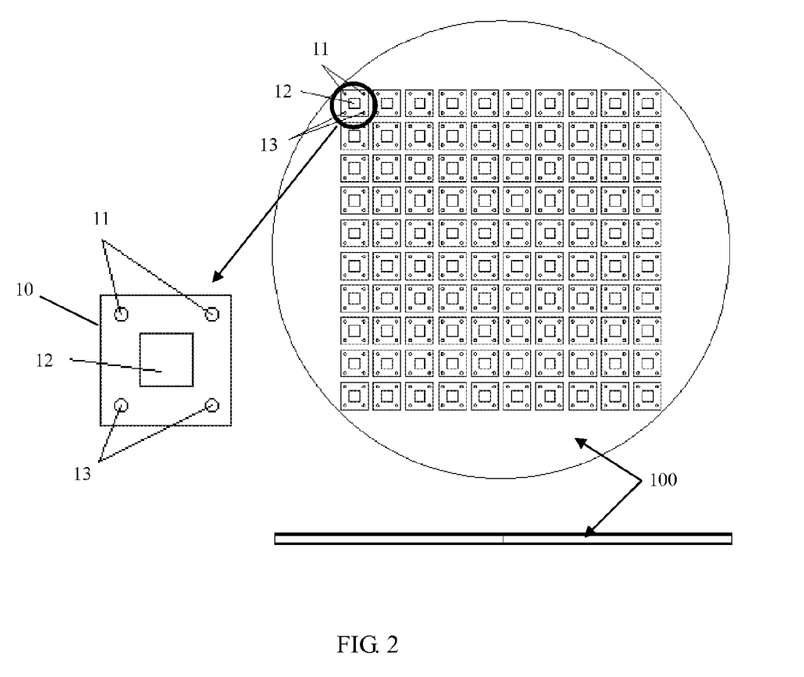
FIG. 2 to FIG. 6 and FIG. 7A to FIG. 7B are schematic diagrams illustrating a method of making a semiconductor package according to an embodiment of the present invention.
Figure 21:
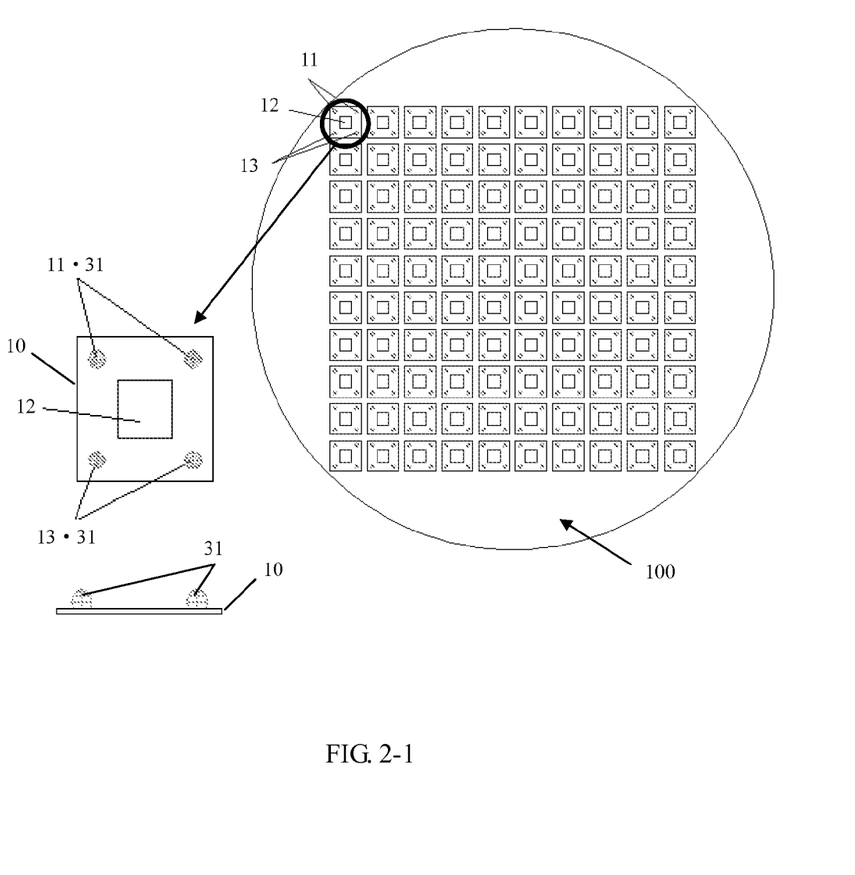

As shown in FIG. 2, a first Ni/Au (nickel/gold) plating wafer 100 with the original thickness is provided. A plurality of first dies 10 are formed on the front surface of the first wafer 100. The first die 10 can be a MOSFET having a gate electrode 11, a source electrode 12 and a drain electrode 13 located at one surface of the first die 10. In one embodiment, all three electrodes are located at the front surface of the first die 10, where the source electrode 12 is located in the center of the first die 10, and the gate electrode 11 and the drain electrodes are located at corners at the front surface of the first die 10 as shown in FIG. 2. As shown in FIG. 2-1, solder balls 31 are formed on the gate electrode 11 and the drain electrode 13 of the first die 10. In one preferred embodiment, the diameter of the solder ball 31 is 0.6 mm before reflow, and its thickness is about 0.48 mm after reflow.

Figure 3:
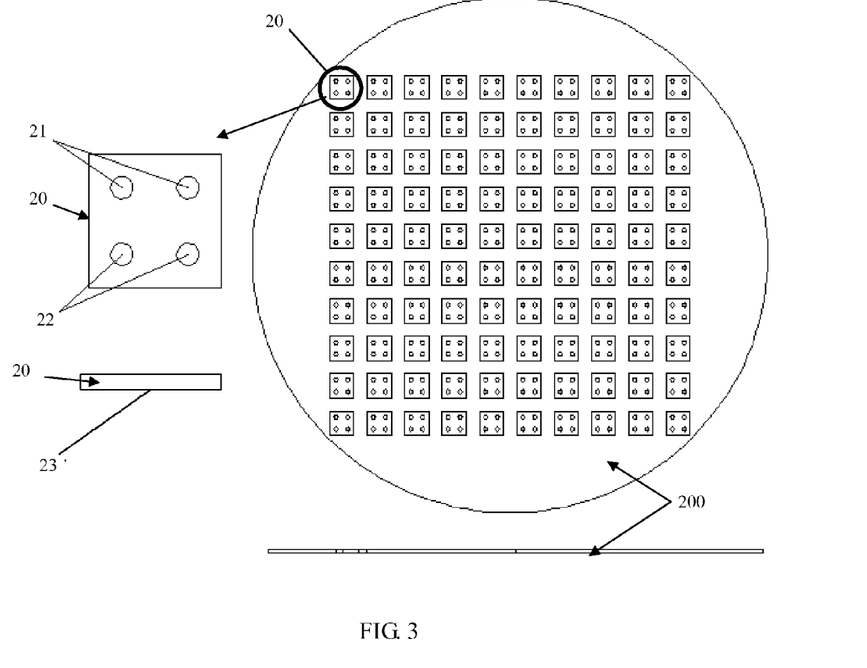

As shown in FIG. 3, a second Ni/Au plating wafer 200 is provided, which is ground on its back surface and then a metal layer is formed at the back surface of the thinned wafer 200. In one embodiment, the thickness of the thinned second wafer 200 is about 0.2 mm, and the back metal layer includes Ti/Ni/Ag (titanium/nickel/silver) or Ti/Ni/Ag/Ni (titanium/nickel/silver/nickel). A plurality of second dies 20 are formed on the front surface of the second wafer 200. The second die 20 can be a MOSFET having a gate electrode 21 and a source electrode 22 separated from each other and located at the corners of the front surface of the second die 20 and a drain electrode 23 located at the back surface of the second die 20.

Figure 4:
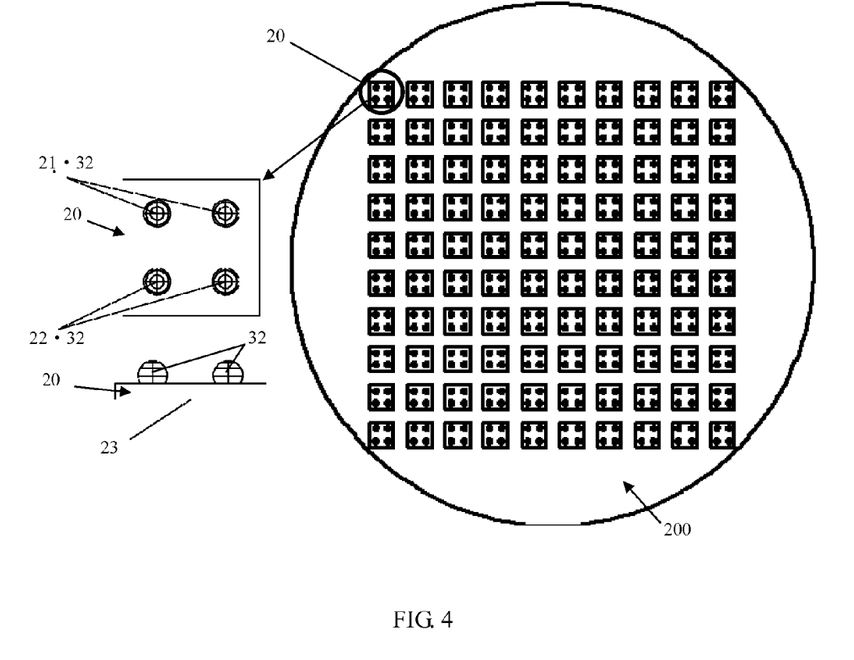
Figure 5:
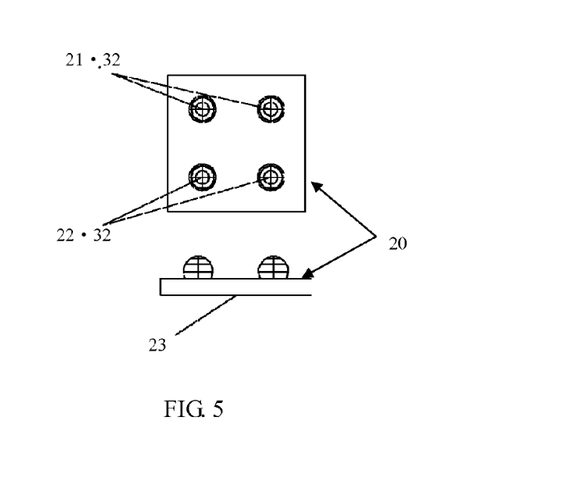

As shown in FIG. 4 and FIG. 5, solder balls 32 are formed on the gate electrode 21 and the source electrode 22 of the second die 20. In one embodiment, the diameter of the solder ball 32 is 0.35 mm before reflow and its thickness is about 0.28 mm after reflow. Then, single dies 20 with the attached solder balls 32 are separated from the second wafer 200.

Figure 6:
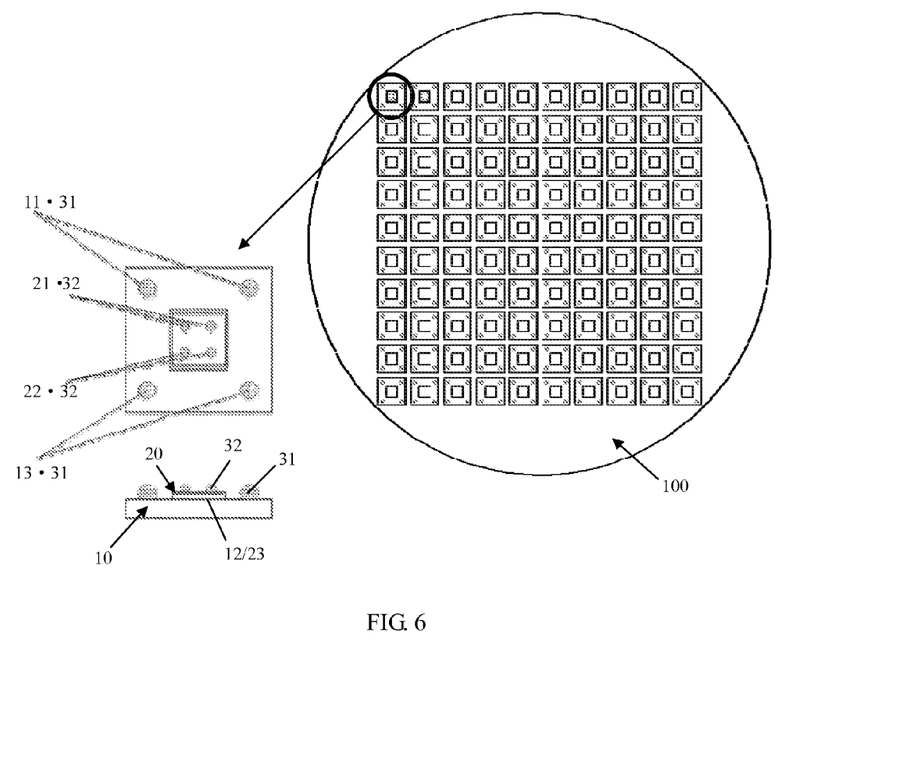

As shown in FIG. 6, a single second die 20 is attached on each first die 10 of the first wafer 100, e.g., using epoxy or other conductive materials, with the drain electrode 23 at the back surface of the second die 20 attached on and electrically connected to the source electrode 12 at the front surface of the first die 10. In a preferred embodiment, the size of the second die is smaller than the size the first die. Furthermore, the size of the second die 20, also the size of the drain electrode 23, is smaller than the size of the source electrode 12 of the first die 10. In one embodiment, the size of the source electrode 12 of the first die 10 is substantially the same as the size of the second die 20.

Figure 7A:
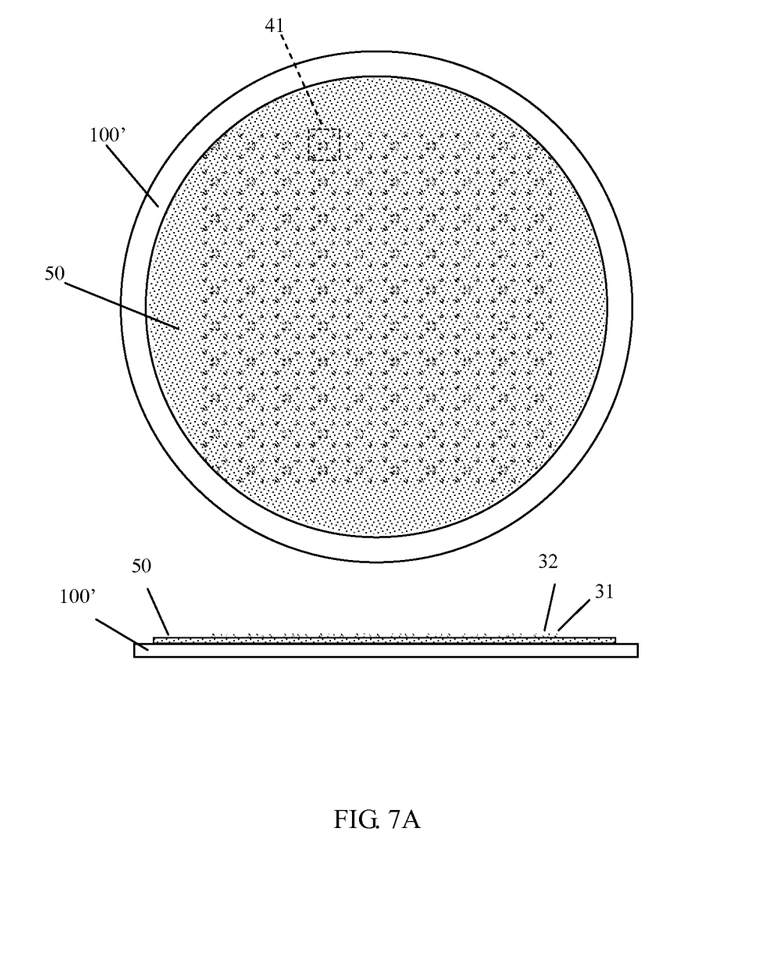
Figure 7B:
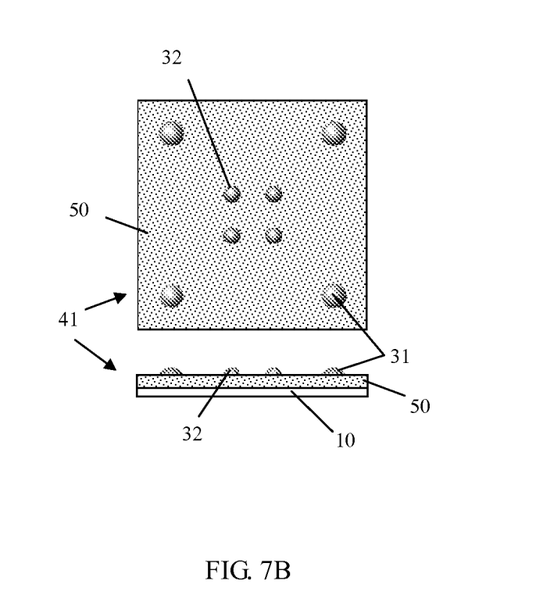

FIGS. 7A-7B show a molding process to form semiconductor packages. As shown in FIG. 7A, a packaging material is deposited on the first wafer 100 to form the package body 50 encapsulating the first die 10 and the second die 20 with the top portions of the solder balls 31 and the solder balls 32 exposed from the top surface of the package body 50. Then, the first wafer 100 is ground from its back surface followed by forming a back metal layer on its back surface. In a preferred embodiment, the thickness of the ground first wafer 100' is 0.2 mm, and the back metal layer preferably includes Ti/Ni/Ag/Ni.

Individual semiconductor packages 41, as shown in FIG. 7B, are separated from the first wafer 100, each of which includes first and second dies 10, 20 and the solder balls 31, 32 encapsulated by the package body 50 with the top portions of the solder balls 31, 32 exposed from the top surface of the package body 50.

Figure 8A:
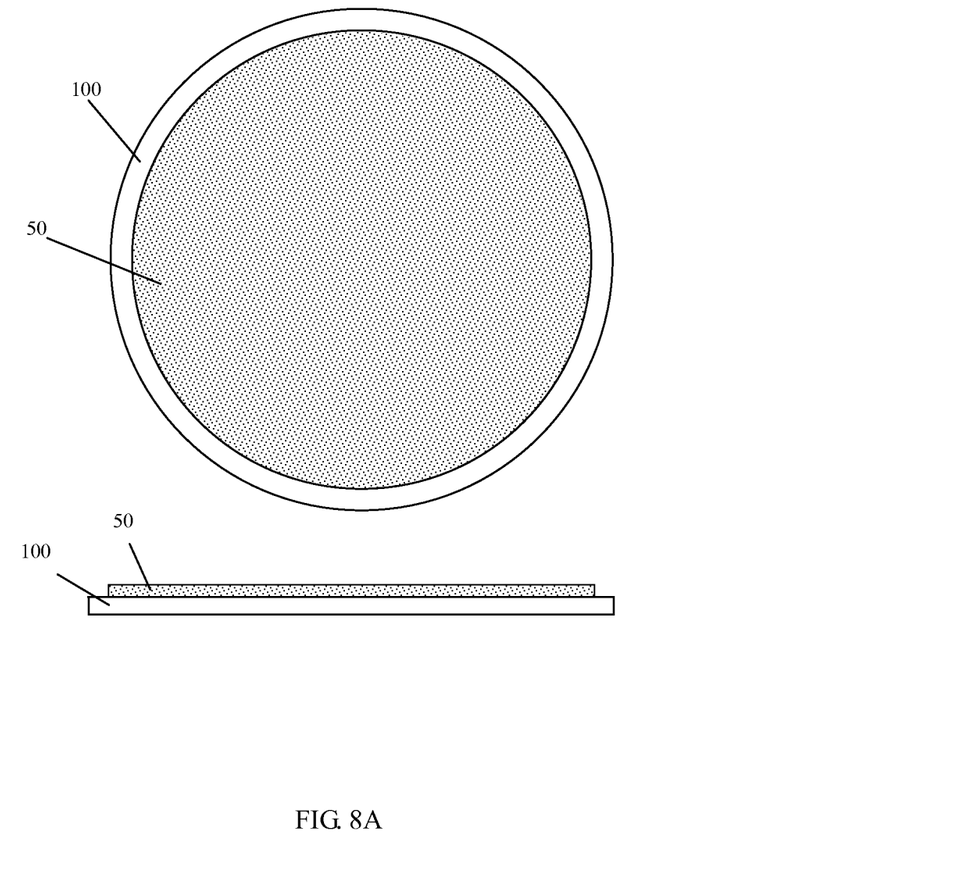
Figure 8B:
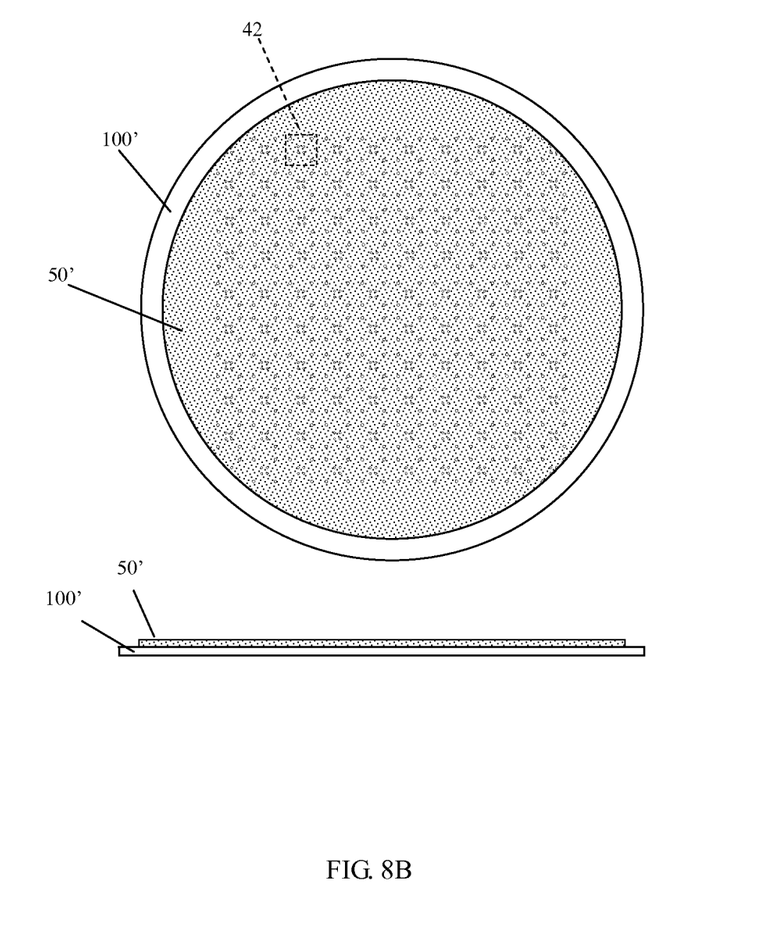
Figure 8C:
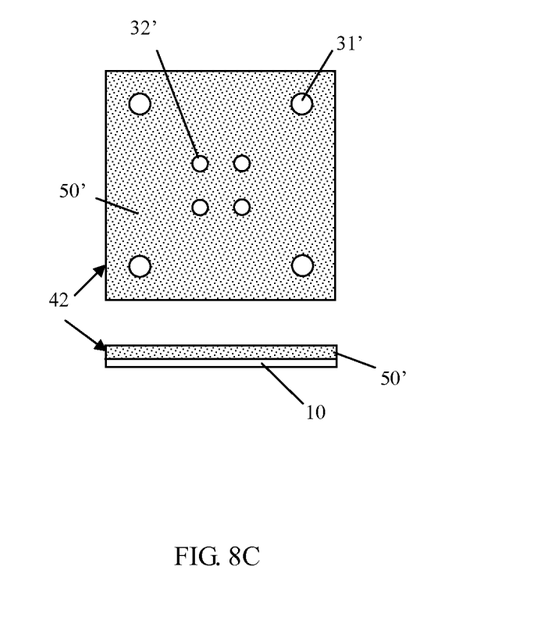

FIGS. 8A-8C show an alternative molding process of the semiconductor packages 42. As shown in FIG. 8A, the packaging material is deposited atop the first wafer 100 to form the package body 50 fully encapsulating the first die 10, the second die 20 and the solder balls 31 and 32. The package body 50 is then ground from its top surface together with top portions of the solder balls 31 and 32 to expose a top surface of the solder balls 31 and 32. Compared with the method described above in FIGS. 7A-7B, the top surface of the ground solder balls 31' and 32' in this process is co-planar with the top surface of the ground package body 50', as shown in FIG. 8B. The first wafer 100 is then ground at its back surface followed by forming the back metal layer at the back surface of the ground first wafer 100'. In one embodiment, the thickness of the ground first wafer 100' is 0.2 mm, and the back metal includes Ti/Ni/Ag/Ni. Individual semiconductor packages 42 are separated from the first wafer 100. As shown in FIG. 8C, each individual semiconductor package 42 includes the first die 10 and the second die 20 and the ground solder balls 31' and 32' encapsulated by the package body 50', in which the ground solder balls 31' and 32' are exposed from the ground package body 50 with the top surfaces of the ground solder balls 31' and 32' and the ground package body 50' being co-planar.

Figure 9:
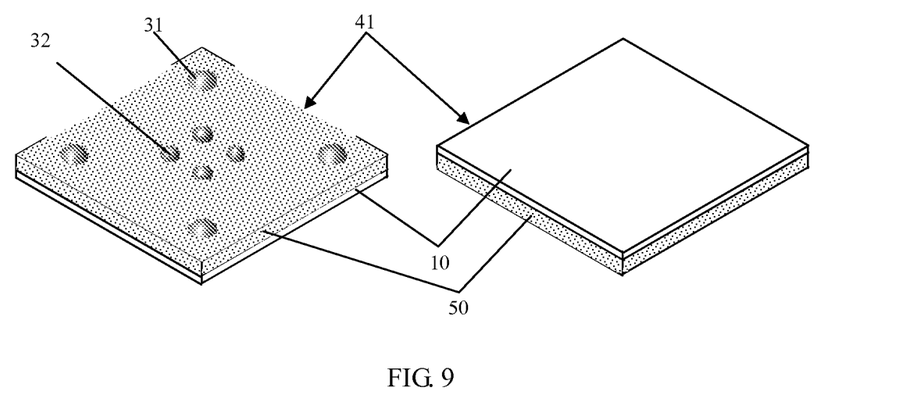
FIG. 9 is perspective views showing the front surface and the back surface of the semiconductor package formed with the method described in FIG. 2 to FIG. 6 and FIG. 7A to FIG. 7B.

FIG. 9 is perspective views of the semiconductor package 41 formed with the packaging method described in FIGS. 1-6 and 7A-7B. As shown in FIG. 9, semiconductor package 41 includes a first die 10 with the larger size and a second die 20 with the smaller size. The first die 10 includes the gate electrode 11, the source electrode 12 and the drain electrode 13 at its front surface with the solder balls 31 formed on the gate electrode 11 and the drain electrode 13. The second die 20 includes the gate electrode 21 and the source electrode 22 at its front surface with the solder ball 32 formed on the gate 21 and the source 22 and the drain 23 electrode at the back surface of the second die 20. The second die 20 is attached on top of the first die 10 with the drain electrode 23 at the back surface of the second die 20 attached on and electrically connected to the source electrode 12 on the front surface of the first die 10 with a conductive epoxy and the like. After molding process, the first die 10 and the second die 20 and the solder balls 31 and 32 are encapsulated inside the package body 50 with the top portions of the solder balls 31 and 32 exposed from the top surface of the package body 50.

Figure 10:
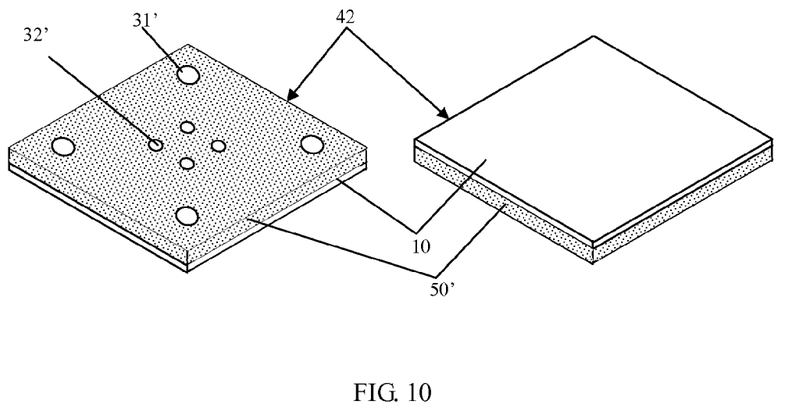
FIG. 10 is perspective views showing the front surface and the back surface of the semiconductor package formed with the method described in FIG. 2 to FIG. 6 and FIG. 8A to FIG. 8C.

FIG. 10 is perspective views of the semiconductor package 42 formed with the method described in FIGS. 1-6 and 8A-8C. The structure of the semiconductor package 42 is similar as the structure of the semiconductor package 41 excepting that after molding and grinding process, the ground solder balls 31 and 32 of the first die 10 and the second die 20 are encapsulated inside the ground package body 50' with the top surface of the ground solder balls 31' and 32' being co-planar with the top surface of the ground package body 50'.

Specifically, as mentioned above, a plurality of first dies 10 are formed on the first Ni/Au plating wafer 100 of an original thickness and a plurality of second dies 20 are formed on the second Ni/Au plating and ground wafer 200 with a back metal layer formed on the back surface of the second Ni/Au plating and ground wafer 200. Furthermore, single second die 20 after separated from the second wafer 200 is attached on the first die 10 of the first wafer 100. After molding process, individual semiconductor packages 41 or 42 are separated from the first wafer.

As mentioned above, the diameter of the solder ball 31 formed at the front surface (located on the gate 11 and drain 13) of the first die 10 is 0.6 mm before reflow and the ball's thickness is about 0.48 mm after reflow. The second wafer 200, also the second dies 20, is thinned to 0.2 mm. The diameter of the solder ball 32 formed at the front surface (located at the gate 21 and the source 22) of the second die 20 is 0.35 mm before reflow and the ball's thickness is about 0.28 mm after reflow. Therefore, the total thickness of the second die 20 and the solder ball 32 after reflow are about 0.48 mm (0.2 mm+0.28 mm=0.48 mm) which is equal to the thickness of the solder ball 31 on the first die 10 after reflow, thus the tops of the solder balls 31 and 32 on the two dies 10, 20 are substantially at the same height level after the second die 20 is attached on the first die 10. As a result, to expose the solder balls 31, 32 from the top surface of the package body 50, (as shown in FIG. 7A), the thickness of the package body 50 deposited on the first wafer 100 is less than the height of the solder ball 31 on the first die 10 after reflow or the total thickness of the second die 20 and the thickness of the solder ball 32 after reflow. On the other hand, for fully encapsulating the solder balls 31, 32 first (as shown in FIG. 8A), the original thickness of the package body 50 deposited on the first wafer is greater than the height of the solder ball 31 of the first die 10 or the total thickness of the ground second die 20 and the thickness of the solder ball 32 after reflow.

In the present invention, in the semiconductor package 41, the drain electrode 23 of the second die 20 is directly and electrically attached on top of the source 12 of the first die 10 and the solder balls 31 and 32 at the front surfaces of the two dies are exposed from the package body 50. Thus, the thickness of the semiconductor package 41 is the total thickness of the thinned first wafer 100', the thinned second wafer 200 and the thickness of the solder ball 32 on the second die 20 after reflow. Compared with the thickness of the conventional semiconductor package (as shown in FIG. 1A), which includes the thickness of the package body encapsulated the first and second dies and the conductive wires connecting the two dies to the electrode pads on the substrate, the thickness of the semiconductor package 41 is reduced. Furthermore, in the semiconductor package 42, the tops of the solder balls 31 and 32 are ground so that the top surface of the ground solder balls 31' and 32' are co-planar with the top surface of the package body 50'; therefore, the thickness of the semiconductor package 42 is further reduced. Furthermore, the back surface of the semiconductor packages 41 or 42, i.e., the back surface of the of the first die 10, including the back metal layer is exposed; therefore, compared with the conventional semiconductor packages, the heat dissipation of the semiconductor packages 41 or 42 is effectively improved.

The above detailed descriptions are provided to illustrate specific embodiments of the present invention and are not intended to be limiting. Numerous modifications and variations within the scope of the present invention are possible. For example, the positions of different electrodes on the two dies described above are only regarded as the example and should not limit other embodiments of the invention. In particular, in one embodiment of the present invention, the drain electrode at the back surface of the second die is electrically attached on the source electrode at the front surface of the first die. In other embodiments of the present invention, one or more electrodes may be insulated and arranged at the back surface of the second die depending on the application of the device so that these electrodes on the back surface of the second die can be directly and electrically attached with one or more corresponding electrodes on the front surface of the first die. Furthermore, solder balls can be formed on one or more electrodes at the front surface of the first and second die to make electrical connection with external circuit boards. For another example, the material for plating or forming the back metal layer, the diameter of the solder ball and the ground wafer thickness are only used for providing one example in order to explain the embodiment of the present invention. Different parameters or material may be selected depending on the devices' application. In addition, the process of forming the electrodes of the first die or the second die is well known in the art. Moreover, the specified sequence of the steps in the method described above can be regulated, for example, the process of forming the first die on the first wafer and the process of manufacturing single second die can be manufactured at the same time. The scope of the invention is defined by the appended claims.

The invention claimed is:

1. A method of manufacturing wafer-level semiconductor packages comprising:
   providing a first wafer comprising a plurality of first dies, each of which comprises first, second and third electrodes formed on its front surface;
   providing a second wafer comprising a plurality of second dies, each of which comprises fourth and fifth electrodes formed on its front surface and a sixth electrode formed at its back surface, the sixth electrode of the second die is different from the second electrode of the first die and separating single second dies from the second wafer;
   attaching a single second die on a first die of the first wafer, wherein the sixth electrode at the back surface of the second die is attached atop and electrically connected to the second electrode at the front surface of the first die; and
   cutting the first wafer to singulate individual semiconductor packages, wherein the back surface of the first die is exposed.

2. The method of claim 1, wherein providing the first wafer comprising a plurality of first dies further comprising forming a first solder ball on each first electrode and third electrode of the first dies; wherein the first solder ball has a first thickness after reflow; and wherein providing the second wafer comprising a plurality of second dies further comprising forming a second solder ball on each fourth and fifth electrodes of the second die; wherein the second solder ball has a second thickness after reflow.

3. The method of claim 2, wherein a total thickness of the second die and the second solder ball formed on the second die after reflow is substantially the same as the first thickness of the first solder ball formed on the first die after reflow.

4. The method of claim 3, before cutting the first wafer to singulate individual semiconductor packages further comprising:
   depositing a package material on the front surface of the first wafer to form a package body with a predetermined thickness that is less than the first thickness of the first solder ball formed on the first die and the total thickness of the second die and the second solder ball formed on the second die; a front surface of the first die and a front surface of the second die are encapsulated inside the package body with the top portions of the first and second solder balls exposed from a top surface of the package body.

5. The method of claim 3 further comprising:
   depositing a package material at the front surface of the first wafer forming a package body with a predetermined thickness that is larger than the first thickness of the first solder ball formed on the first die and the total thickness of the second die and the second solder ball formed on the second die wherein the first die and the second die and the first and second solder balls are encapsulated inside the package body; and
   grinding from a top surface of the package body to expose the first and second solder balls, wherein the top surface of the ground first and second solder balls and the top surface of the package body are co-planar.

6. The method of claim 1, wherein the surfaces of the first wafer and the second wafer are plated with Ni/Au.

7. The method of claim 1, wherein a back metal layer is formed at the back surface of the second wafer before the individual second dies are separated from the second wafer, wherein the back metal layer comprises Ti/Ni/Ag or Ti/Ni/Ag/Ni.

8. The method of claim 1, wherein a back metal layer is formed on the back surface of the first wafer before cutting the first wafer to singulate individual semiconductor packages.

9. The method of claim 8, wherein the first wafer is ground from the back surface before forming the back metal layer, wherein the back metal layer comprises Ti/Ni/Ag/Ni.

10. The method of claim 1 wherein the first and second dies are metal-oxide-semiconductor field-effect transistors (MOSFETs) and the first, second and third electrodes include a gate electrode, a source electrode and a drain electrode respectively, and the fourth, fifth and sixth electrodes include a gate electrode, a source electrode and a drain electrode respectively.

11. The method of claim 10, wherein the first electrode and the third electrode at the front surface of the first die comprise the gate electrode and the drain electrode and the second electrode at the front surface of the first die is the source electrode; and wherein the fourth and fifth electrodes at the front surface of the second die comprises the gate and the source electrodes and the sixth electrode at the back surface of the second die is the drain electrode; therefore, the drain electrode of the second die is attached on and electrically connected to the source electrode of the first die.

12. A semiconductor package comprising:
   a first die comprises first, second and third electrodes formed on its front surface, and first solder balls formed on the first and third electrodes of the first die;
   a second die comprises fourth and fifth electrodes formed on its front surface and a sixth electrode formed at its back surface and second solder balls formed on the fourth and fifth electrodes of the second die, the sixth electrode of the second die is different from the second electrode of the first die
   wherein the sixth electrode at the back surface of the second die is attached on and electrically connected to the second electrode at the front surface of the first die; and
   a package body encapsulating the first die, the second die, the first solder balls and the second solder balls.

13. The semiconductor package of claim 12, wherein the first and second dies are MOSFETs.

14. The semiconductor package of claim 13, wherein the first solder ball formed on the first and third electrodes of the first die has a first thickness after reflow and the second solder balls formed on the fourth and fifth electrodes of the second die has a second thickness after reflow.

15. The semiconductor package of claim 14, wherein a total thickness of the second die and the second solder ball on the second die is substantially the same as the first thickness of the first solder ball on the first die.

16. The semiconductor package of claim 15, wherein the first die and the second die are encapsulated inside the package body with the top portions of the first and second solder balls on the first die and the second die exposed outside the top surface of the package body.

17. The semiconductor package of claim 15, wherein the first and second dies and the first and second solder balls are encapsulated inside the package body, wherein the top surface of the first and second solder balls and the top surface of the package body are coplanar with the top surface of the first and second solder balls exposed outside the top surface of the package body.

18. The semiconductor package of claim 13, wherein the first die and the second die comprise plated Ni/Au layers formed on the surfaces of the first and the second dies.

19. The semiconductor package of claim 13, wherein the second die includes a back metal layer comprising Ti/Ni/Ag or Ti/Ni/Ag/Ni formed at its back surface, and wherein the first die includes a back metal layer comprising Ti/Ni/Ag or Ti/Ni/Ag/Ni formed at its back surface exposed outside the package body.

20. The semiconductor package of claim 12, wherein a size of the second die is smaller than a size of the first die.

* * * * *